(12) United States Patent
Yukawa et al.

(10) Patent No.: US 7,358,590 B2
(45) Date of Patent: Apr. 15, 2008

(54) SEMICONDUCTOR DEVICE AND DRIVING METHOD THEREOF

(75) Inventors: Mikio Yukawa, Atsugi (JP); Yoshinobu Asami, Atsugi (JP); Ryoji Nomura, Yamato (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/370,837

(22) Filed: Mar. 9, 2006

(65) Prior Publication Data

US 2006/0220252 A1    Oct. 5, 2006

(30) Foreign Application Priority Data

Mar. 31, 2005    (JP)    ............................. 2005-103559

(51) Int. Cl.
*H01L 29/00*    (2006.01)

(52) U.S. Cl. .................. 257/530; 257/50; 257/928; 438/467; 365/100

(58) Field of Classification Search .................. 257/40, 257/642, 643, E51.008, E23.147, 50, 530, 257/928; 438/467; 337/114, 306, 15, 19, 337/24, 310; 219/496; 365/94, 96, 100
See application file for complete search history.

(56) References Cited

U.S. PATENT DOCUMENTS

| | | | |
|---|---|---|---|
| 5,206,665 A | | 4/1993 | Kawade et al. |
| 5,389,475 A | | 2/1995 | Yanagisawa et al. |
| 5,625,219 A | * | 4/1997 | Takagi .......................... 257/530 |
| 5,780,919 A | * | 7/1998 | Chua et al. .................. 257/530 |
| 6,034,882 A | * | 3/2000 | Johnson et al. .............. 365/103 |
| 6,288,437 B1 | * | 9/2001 | Forbes et al. ................ 257/530 |
| 6,465,282 B1 | * | 10/2002 | Tobben et al. .............. 438/131 |
| 6,528,815 B1 | | 3/2003 | Brown et al. |
| 6,750,530 B1 | * | 6/2004 | Klaasen et al. ............. 257/530 |
| 6,828,685 B2 | | 12/2004 | Stasiak |
| 6,844,609 B2 | * | 1/2005 | Motsiff et al. ............... 257/530 |
| 6,962,844 B2 | | 11/2005 | Stasiak |
| 6,979,880 B2 | * | 12/2005 | Bhattacharyya et al. .... 257/530 |
| 7,034,380 B2 | * | 4/2006 | Andideh ...................... 257/635 |
| 2003/0156449 A1 | | 8/2003 | Ooishi |
| 2003/0183699 A1 | | 10/2003 | Masui |

(Continued)

FOREIGN PATENT DOCUMENTS

WO    WO 2004/015778    2/2004

(Continued)

*Primary Examiner*—Minsun Oh Harvey
*Assistant Examiner*—Joshua J King
(74) *Attorney, Agent, or Firm*—Eric J. Robinson; Robinson Intellectual Property Law Office, P.C.

(57) ABSTRACT

A semiconductor device includes a memory with a simple structure, an inexpensive semiconductor device, a manufacturing method and a driving method thereof. One feature is that, in a memory which has a layer including an organic compound as a dielectric, by applying a voltage to a pair of electrodes, the state change caused by the precipitous change in volume (such as bubble generation) is generated between the pair of electrodes. Short-circuiting between a pair of electrodes is promoted by acting force based on this state change. Concretely, a bubble generating area is provided in the memory element to generate a bubble between the first conductive layer and the second conductive layer.

17 Claims, 12 Drawing Sheets

U.S. PATENT DOCUMENTS

| | | |
|---|---|---|
| 2003/0230746 A1 | 12/2003 | Stasiak |
| 2004/0026690 A1* | 2/2004 | Bernds et al. ................ 257/40 |
| 2004/0027849 A1 | 2/2004 | Yang et al. |
| 2004/0164302 A1 | 8/2004 | Arai et al. |
| 2004/0217441 A1* | 11/2004 | Lehmann et al. ........... 257/530 |
| 2005/0006640 A1* | 1/2005 | Jackson et al. ............... 257/40 |
| 2006/0097250 A1* | 5/2006 | Koyama et al. .............. 257/40 |
| 2006/0175648 A1* | 8/2006 | Asami ........................ 257/296 |
| 2006/0263634 A1* | 11/2006 | Yamazaki ................... 428/690 |

FOREIGN PATENT DOCUMENTS

WO    WO 2005/096380    10/2005

* cited by examiner

SEMICONDUCTOR DEVICE AND DRIVING METHOD THEREOF

BACKGROUND OF THE INVENTION

1. Field of the Invention

The present invention relates to a semiconductor device which can store data or transmit and receive data, and a manufacturing method of the semiconductor device.

Note that the term "a semiconductor device" in this specification refers to general devices which can function using a semiconductor characteristic, and electro-optic devices, semiconductor circuits and electronic devices are regarded as semiconductor devices.

2. Description of the Related Art

In recent years, semiconductor devices which transmit and receive data by electromagnetic waves or radio waves, without contact, have been actively developed. Such semiconductor devices are referred to as RF (Radio Frequency) tags, wireless tags, electronic tags, transponders or the like. Most semiconductor devices currently in practical use have circuits each using a semiconductor substrate (also referred to as an IC (Integrated Circuit) chip) and an antenna. The IC chip is incorporated with a memory or a control circuit.

SUMMARY OF THE INVENTION

Semiconductor devices which can transmit and receive data without contacts have been used in cards serving as train tickets or some money cards, and for the wider spread of such semiconductor devices, it is extremely needed to provide inexpensive semiconductor devices. In view of the need, it is an object of the present invention to provide semiconductor devices having a memory with a simple structure, inexpensive semiconductor devices and a manufacturing method of the same.

According to the teachings of the present invention, a memory uses a layer including an organic compound as a dielectric, and by applying a voltage to a pair of electrodes, the state change caused by the precipitous change in volume (such as bubble generation) is generated between the pair of electrodes. One feature of the present invention is to promote short-circuiting between a pair of electrodes by employing acting force based on this state change.

A structure of the present invention disclosed in this specification is a semiconductor device comprising a plurality of bit lines extending in a first direction; a plurality of word lines extending in a second direction which is perpendicular to the first direction; and a memory element, wherein the memory element has a stacked structure of a first conductive layer forming the bit lines, a layer including an organic compound, and a second conductive layer forming the word lines, and wherein the memory element includes a bubble generating area and a bubble is generated between the first conductive layer and the second conductive layer.

Note that a bubble generating area may be a part of the first conductive film, the layer including an organic compound, or the second conductive layer which each constitutes a part of the memory element. For example, as a material of the first conductive layer included in an organic memory, a conductive material which easily generates bubbles by heat may be used. In addition, the first conductive layer may be doped with an inert element such as nitrogen or argon. In forming the first conductive layer by a sputtering method, the first conductive layer may be formed in an atmosphere including an inert element such as argon or nitrogen so that it includes the inert element.

When a part of a layer including an organic compound is used as the bubble generating area, a material which easily generates bubbles by Joule heat or the like generated by applying a voltage to the pair of electrodes may be used as a dielectric of an organic memory. For example, an organic material which generates a gas by being dissolved in supplying electrons, typically, carboxylate salt (ammonium benzoate, tetrabutylammonium acetate or the like) can be used. In a case of forming a layer including an organic compound by a coating method, since a solvent which is easy to be evaporated in the coating step, is used, a bubble is easy to be generated by Joule heat or the like generated by applying a voltage to the pair of electrodes.

In addition, when fluidity in melting of the layer including an organic compound is increased, a bubble is easy to be generated. Thus, the layer including an organic compound preferably employs a material having a low glass transition temperature so that the layer including an organic compound is easily melted in application of voltage. Another structure of the present invention is a semiconductor device comprising a plurality of bit lines extending in a first direction; a plurality of word lines extending in a second direction which is perpendicular to the first direction; and a memory element, wherein the memory element has a stacked structure of a first conductive layer forming the bit lines, a layer including an organic compound, and a second conductive layer forming the word lines, and wherein the layer including an organic compound includes an organic compound having a glass transition temperature of 50° C. to 200° C., preferably 50° C. to 100° C. In a case where the organic compound has a glass transition temperature of lower than 50° C., an initial characteristic of an organic memory easily becomes unstable, and there is a fear that it is affected by heat generated outside (from an integrated circuit, an IC, a panel or a battery provided around the memory). On the contrary, in a case where the organic compound has a glass transition temperature of higher than 200° C., since the layer including an organic compound is difficult to be melted unless a voltage having a high voltage value is applied or a voltage is applied for a long time, the fluidity is small and thus, a bubbles is difficult to be generated.

In forming a layer including an organic compound by an evaporation method, the layer including an organic compound may be formed in an atmosphere including an inert element such as nitrogen or argon so that the layer including an organic compound includes the inert element such as nitrogen or argon. In particular, since the layer including an organic compound formed by an evaporation method has a low glass transition temperature of 200° C. or lower, it can become a liquid or a gas at a heating temperature of 100° C. to 300° C.

Further, as a material of the second conductive layer of the organic memory, a conductive material which easily generates bubbles by heat, may be used. In forming the second conductive layer by an evaporation method, the second conductive layer may be formed in an atmosphere including an inert element such as nitrogen or argon so that it contains the inert element.

In each of the above structures, the semiconductor device has one feature that, when a voltage is applied between the first conductive layer and the second conductive layer to generate a bubble from the bubble generating area, and by the pressure caused by the bubble generation, the first conductive layer and the second conductive layer are short-circuited to write data in a memory device. By the pressure based on the generated bubbles, the change of the interval between the first conductive layer and the second conductive, layer is partially caused, and a voltage is concentrated on a portion having narrower interval than the other portions to easily generate short-circuiting. That a voltage is difficult to be applied to the concentrated area of bubbles when the bubbles are generated by the voltage application, is a cause of promoting short-circuiting.

In each of the above structures, the semiconductor device has one feature that bubbles are generated from the bubble generating area by heat generated between the first conductive layer and the second conductive layer, and by the pressure based on the generated bubbles, the change of the interval between the first conductive layer and the second conductive layer is partially caused to promote writing of data in the memory element.

Because of volume shrinkage in the voltage application or the like, minute bubbles (1 μm to 10 μm) are formed. Metal wirings above and below the layer including an organic compound may be short-circuited through the bubbles.

In addition, a bubble may be formed before the voltage application, and metal wirings above and below the layer including an organic compound may be short-circuited through the bubble. Another structure of the present invention is a semiconductor device comprising at least a plurality of bit lines extending in a first direction; a plurality of word lines extending in a second direction which is perpendicular to the first direction; and a memory element, wherein the memory element has a stacked structure of a first conductive layer forming the bit lines, a layer including an organic compound, and a second conductive layer forming the word lines, and wherein the memory element has a bubble between the first conductive layer and the second conductive layer.

When bubbles are generated before the voltage application, more bubbles are generated by heat generated between the first conductive layer and the second conductive layer, and by the pressure based on the generated bubbles, the interval between the first conductive layer and the second conductive layer is partially changed to promote writing data in a memory element.

In the above structure, the bubble is overlapped with a portion of the first conductive layer and a portion of the second conductive layer, and an interval of the portion of the first conductive layer and the portion of the second conductive layer is larger than other portions.

One feature of the present invention is a driving method of a semiconductor device comprising the steps of applying a voltage to a memory device in which a first conductive layer, a layer including an organic compound and a second conductive layer; generating a bubble between the first conductive layer and the second conductive layer; and short-circuiting the first conductive layer and the second conductive layer by a pressure based on the generated bubble so as to write data in the memory element.

One feature of the present invention is a driving method of a semiconductor device comprising the steps of applying a voltage to a memory device in which a first conductive layer, a layer including an organic compound and a second conductive layer, to generate heat in the memory element; generating a bubble between the first conductive layer and the second conductive layer by the heat generated in the memory element; and partially changing an interval of the first conductive layer and the second conductive layer by a pressure based on the generated bubble so as to write data in the memory element.

In each of the features described above, the layer including an organic compound includes an organic compound having a glass transition temperature of 50° C. to 200° C.

According to the teachings of the present invention, a semiconductor device including a memory with a simple structure can be provided and an inexpensive semiconductor device can be provided. Further, wiring of data in a memory cell can be conducted with a lower power consumption in accordance with the present invention.

DETAILED DESCRIPTION OF THE INVENTION

Figure 1A:
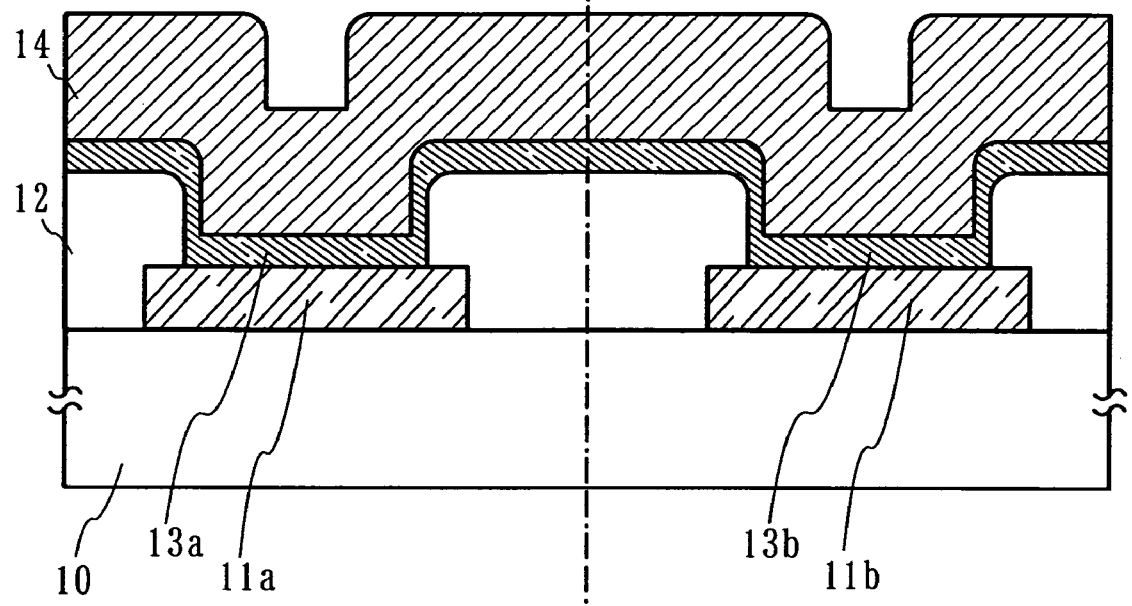
FIGS. 1A and 1B are cross-sectional views showing modes of a memory element before and after a voltage is applied.

Hereinafter, the embodiment modes of the present invention will be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that in the drawings, the same reference numerals are used for the same portions or the portions having the same functions, and the description thereof is not made repeatedly.

Embodiment Mode 1

Figure 1B:
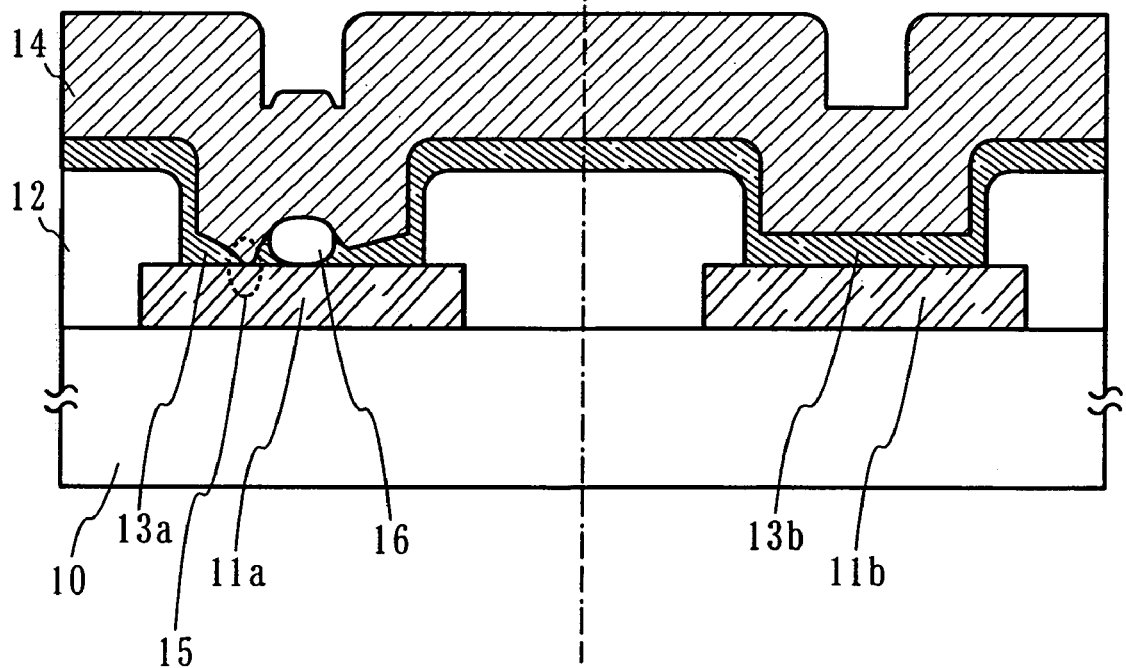

FIGS. 1A and 1B are specific cross-sectional views showing a memory element having a layer including an organic compound (hereinafter, referred to as an organic memory) as one example of semiconductor devices of the present invention.

FIG. 1A shows cross sections of two memory elements provided over a substrate 10 having an insulating surface. FIG. 1A shows a state before writing.

Over the substrate 10 having an insulating surface, a first conductive layer 11a constituting a bit line of the first memory element, and a first conductive layer 11b constituting a bit line of the second memory element are provided. As the first conductive layers 11a and 11b, a conductive material which easily generates bubbles by heat may be used.

In addition, an insulator 12 is provided to cover the vicinity portion of the first conductive layer. The insulator 12 is arranged at the boundary between the adjacent memory elements, and covers to surround the vicinity portion of the first conductive layers 11a and 11b. As the insulator 12, a single layer or a stacked layer of inorganic materials having oxygen or nitrogen such as silicon oxide (SiOx), silicon nitride (SiNx), silicon oxynitride (SiOxNy) (x>y), silicon nitride oxide (SiNxOy) (x>y) can be used. Moreover, a single layer or a stacked layer of organic materials such as polyimide, polyamide, poly vinylphenol, benzocyclobutene, acryl, or epoxy, is used to form the insulator 12. In addition, an inorganic material and an organic material may be stacked.

In addition, the second conductive layer 14 can be formed of a single layer or a stacked layer which is formed from an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), or the like; or an alloy containing some of the elements. It should be noted that the second conductive layer 14 is preferably a material through which a bubble generated in applying a voltage to a pair of electrodes does not pass.

In addition, a layer including an organic compound (the layer includes a layer including an organic compound 13a of the first memory element and a layer including an organic compound 13b of the second memory element) is provided between the first conductive layers 11a, 11b and the second conductive layer 14. The layers including an organic compound 13a, 13b are formed as a single layer or a stacked layer of conductive organic compound materials. As specific examples of the conductive organic compound materials, a material having a carrier transportability can be used. The layers including an organic compound 13a, 13b may be formed of a material which easily generates bubbles by heat.

FIG. 1B is a cross-sectional view showing a state after a voltage is applied to one of the two memory elements, i.e., the first memory element, to write data.

A voltage which is higher than a certain voltage value is applied to the first conductive layer 11a and the second conductive layer 14 of the first memory element, and thus, the layer including an organic compound 13a is melted by Joule heat or the like to easily become fluid. A bubble 16 is generated by Joule heat caused by the voltage application, or peeling is partially caused near the interface of layers due to the impact following the voltage application. By the pressure based on occurrence of the bubble 16 or a partial peeling, the interval of the first conductive layer 11a and the second conductive layer 14 is partially changed. Since the voltage is concentrated on a portion having a narrower interval than the other portions, a short-circuiting portion 15 is formed. In addition, by the impact due to the voltage application, the first conductive layer is deformed, and a swelling portion is partially formed in some cases. There is a case that, in the vicinity of the swelling portion, bubbles or a partial peeling is generated.

In this way, the conductivity of the first memory element is changed, thereby making it possible to store two values corresponding to the initial state and the state after the conductivity has changed, respectively.

In addition, some examples are shown hereinafter, in which a bubble generating area is provided in the memory element.

Figure 2A:
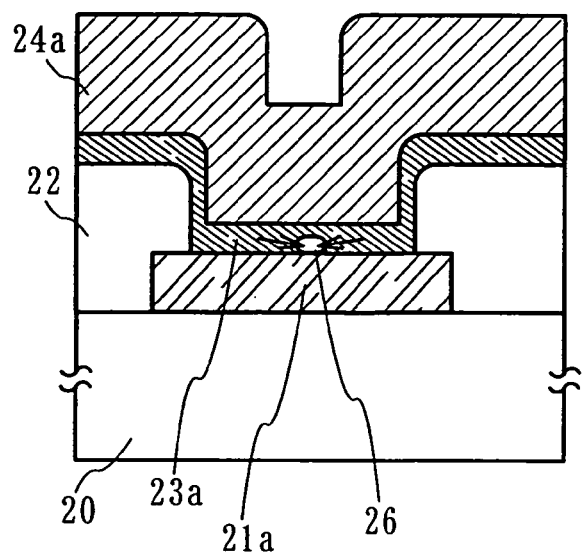
FIGS. 2A to 2C are cross-sectional views showing how a bubble is generated.

When a memory element is formed, a layer including an organic compound 23a of the memory element is deposited in an atmosphere including an inert gas by an evaporation method. FIG. 2A shows a state in which by applying a voltage to the first conductive layer 21a and the second conductive layer 24a, various gas components from the layer including an organic compound 23a are concentrated, thereby forming a bubble 26. At this time, it can be said that a bubble generating area of the memory element is the layer including an organic compound layer 23a. It should be noted that a first conductive layer 21a is formed over a substrate 20 having an insulating surface, and a vicinity of the first conductive layer 21a is covered by a partition 22.

Figure 2B:
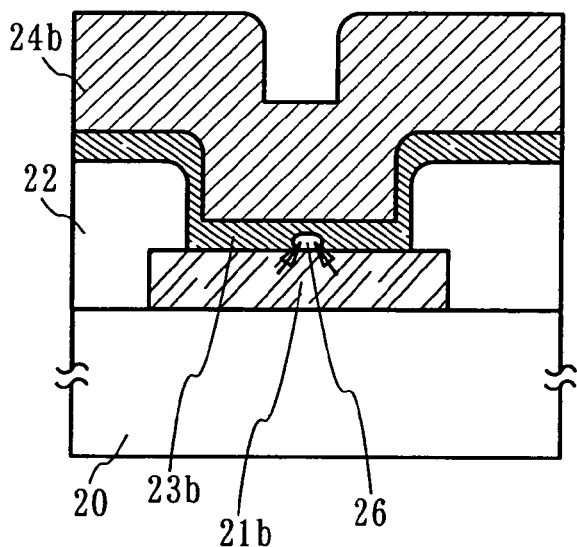

In addition, as another example, the first conductive layer 21b of the memory element is formed by a sputtering method in an atmosphere including an inert gas or the like, when the memory element is formed. FIG. 2B shows a state in which by applying a voltage to the first conductive layer 21b and the second conductive layer 24b, various gas components are concentrated mainly from the first conductive layer 21b, thereby forming a bubble 26. At this time, it can be said that a bubble generating area of the memory element is the first conductive layer 21b.

Figure 2C:
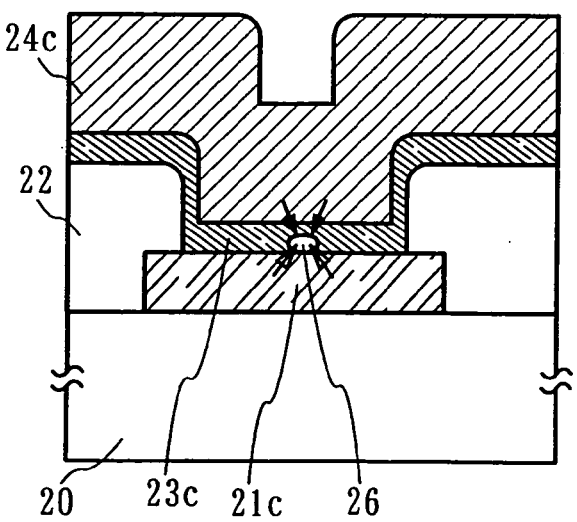

In addition, as another example, the first conductive layer 21c of the memory element is formed by a sputtering method in an atmosphere including an inert gas or the like, and a second conductive layer 24c of the memory element is formed by an evaporation method in an atmosphere including an inert gas or the like, when the memory element is formed. FIG. 2C shows a state in which by applying a voltage to the first conductive layer 21c and the second conductive layer 24c, various gas components are concentrated mainly from the first conductive layer 21c and the second conductive layer 24c, thereby forming a bubble 26. At this time, it can be said that a bubble generating area of the memory element is both the first conductive layer 21c and the second conductive layer 24c.

The present invention is not limited to the three examples described above, and a bubble generating area can be provided in the memory element.

Figure 3:
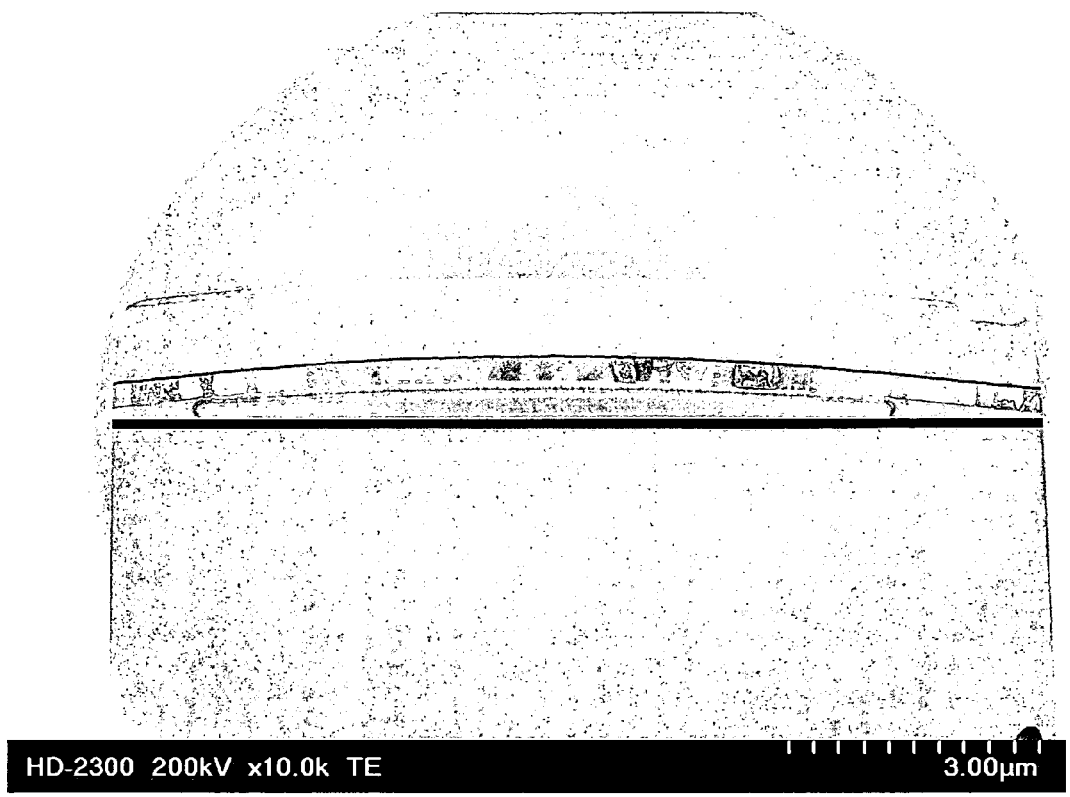
FIG. 3 is a TEM photograph of a portion in which a bubble is formed.

FIG. 3 shows a cross sectional TEM photograph of a portion in which a bubble is formed between a pair of electrodes, by applying a voltage to the pair of electrodes of an organic memory (the size is 2 mm×2 mm). In FIG. 3, it can be observed that a bubble having a diameter of 7 µm to 8 µm is formed, and a portion in which the second conductive layer is pushed up and a portion in which the layer including an organic compound becomes thin, exist. Although the layer including an organic compound has an even thickness before the voltage application, the thickness is greatly changed after the voltage application. Thus, the interval of the pair of electrodes is partially changed. It should be noted that the organic memory has a short-circuiting portion, although the short-circuiting portion is not shown in FIG. 3.

The stacked structure of the organic memory shown in FIG. 3 adopts a transparent conductive layer having a thickness of 110 nm which is formed by a sputtering method, as the first conductive layer. As the transparent conductive layer of the organic memory, ITO (indium zinc oxide) or ITSO (indium tin oxide containing silicon oxide obtained by a sputtering method using an ITO target containing 2 wt % to 10 wt % of silicon oxide) is used. Other than ITSO, a transparent conductive film such as a light transmitting conductive oxide film (IZO) containing silicon oxide in which indium oxide is mixed with 2% to 20% of zinc oxide (ZnO) may be used. Here, ITO containing a slight amount of Si (ITSO) is used as the transparent conductive layer. In addition, as the second conductive layer, an aluminum film of 270 nm in thickness obtained by an evaporation method is used. In addition, as the layer including an organic compound formed between the first conductive layer and the second conductive layer, TPD (4,4'-bis[N-(3-methylphenyl)-N-phenyl-amino]-biphenyl) of 35 nm thick which is obtained by an evaporation method, is used. It should be noted that the glass transition temperature Tg of TPD is 60° C.

Figure 11:
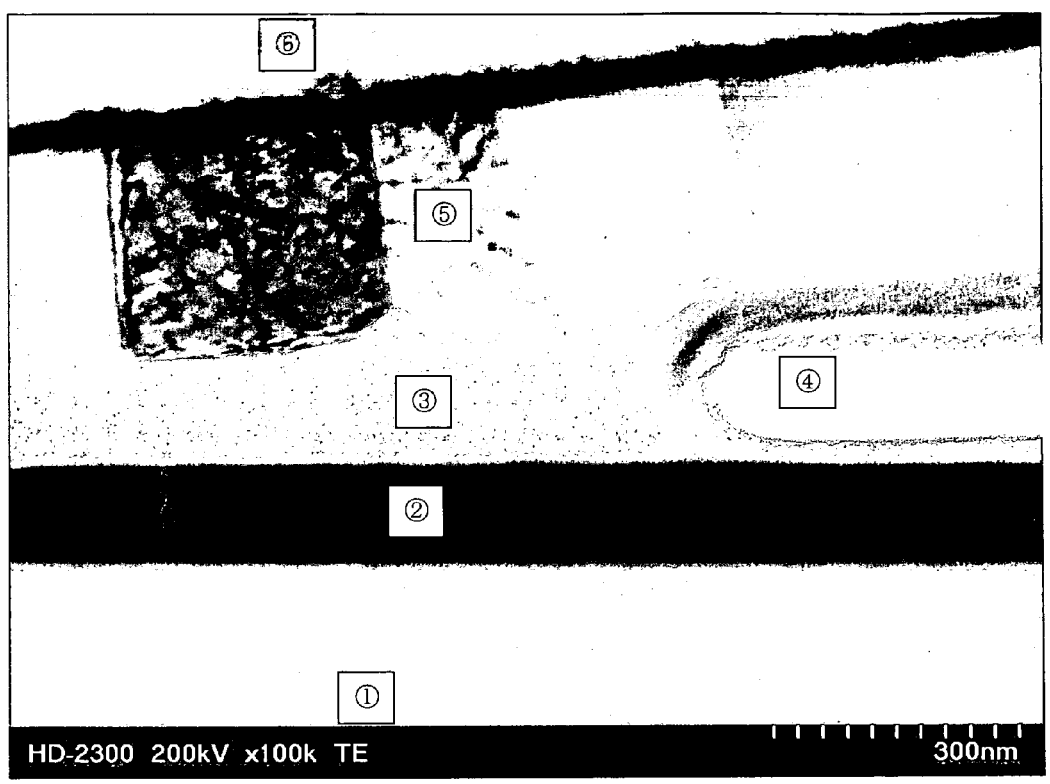
FIG. 11 is a TEM photograph showing a partial enlarged portion of a portion in which a bubble is formed and positions which are subjected to EDX spectrum measurement.
Figure 12:
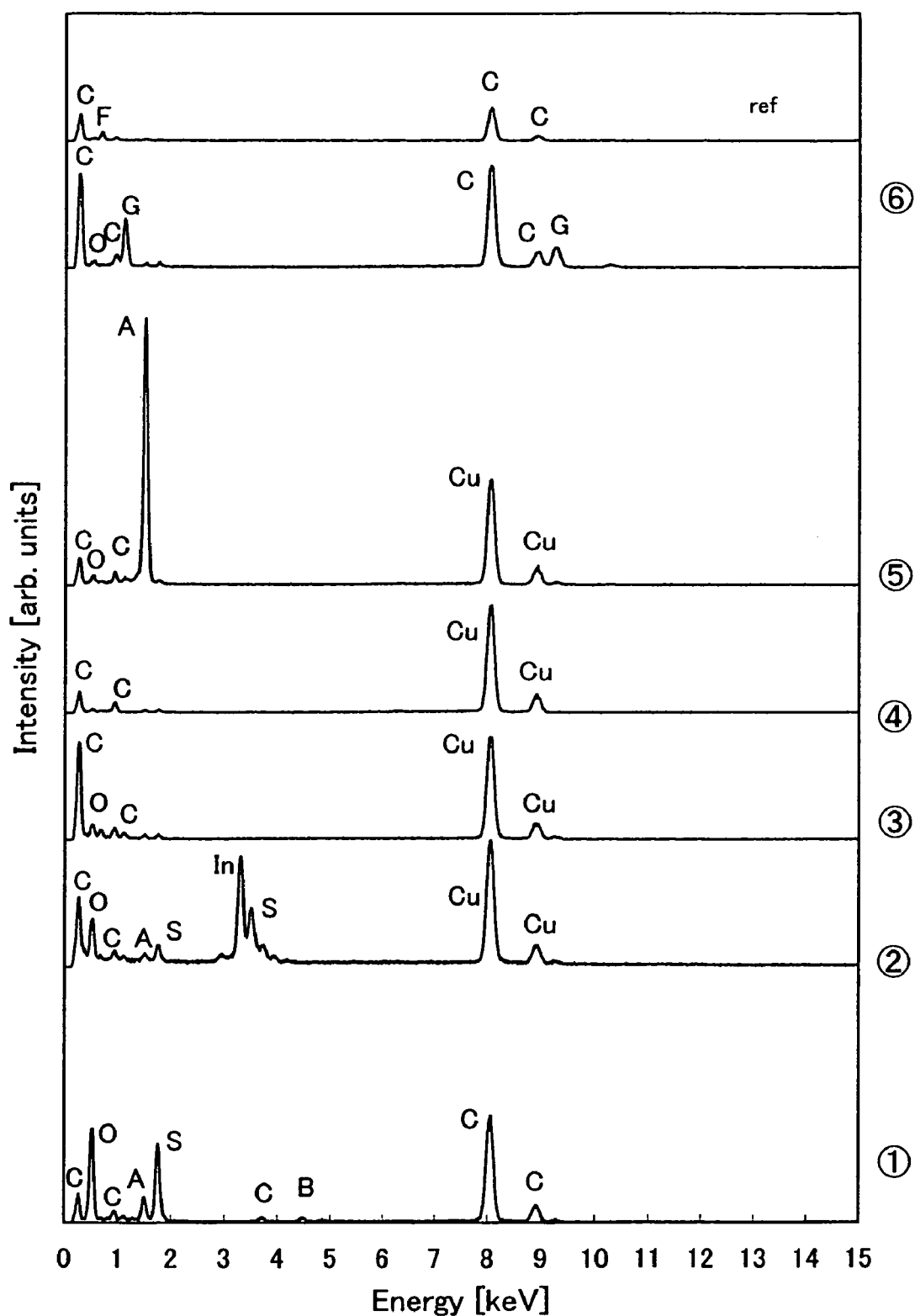
FIG. 12 is a graph showing results of the EDX spectrum measurement.

In addition, a spectrum measurement using an X ray micro analyzer (EDX) is conducted to the portion in which the bubble is formed and the vicinity thereof. Positions for EDX measurement of the portion in which the bubble is formed and the vicinity thereof are shown in a TEM photograph shown in FIG. 11. FIG. 12 shows results of EDX spectrum measurement which are conducted to the positions (six positions) shown in FIG. 11.

In the spectrum measurement by EDX, secondary X rays which are obtained by irradiating the measurement positions with an electron beam (200 keV) are measured. The peak of Cu is observed in each spectrum. This is because a mesh in which a collodion film is formed, is made of Cu. It can be regarded that this is not because the mesh portion is irradiated with the electron beam, but because a part of the irradiated electron beam is scattered when it touches the sample, and the scattered beam touches the mesh portion, and Cu characteristic X ray is observed. Since Cu is observed also in the seventh spectrum for the collodion film used as a reference, it can be understood that the peak of Cu is nonessential. In addition, although there are spectra showing C or Ga, there is a possibility that the spectra of C or Ga are observed because of contamination or FIB incidence ion.

The first spectrum is a measurement result for a glass substrate; the second spectrum a measurement result for ITO containing a slight amount of Si (the first conductive layer); the third spectrum is a measurement result for TPD; the fifth spectrum is a measurement result for aluminum (the second conductive layer); the sixth spectrum is a measurement result for a carbon coat later which is deposited in FIB process; and the seventh spectrum is a measurement result for the collodion film used as the reference.

The measurement result of the bubble portion is shown by the fourth spectrum, and the observed spectrum components are Cu and C. Cu is observed because of a mesh as described above. C detected as the spectrum component of the fourth spectrum is much smaller than the peak of C in the spectrum of TPD, and is almost the same as that in the spectrum of the collodion film used as the reference.

Therefore, according to TEM observation and the EDX measurement, it can be confirmed that no substance exist in the bubble portion.

Embodiment Mode 2

Figure 4A:
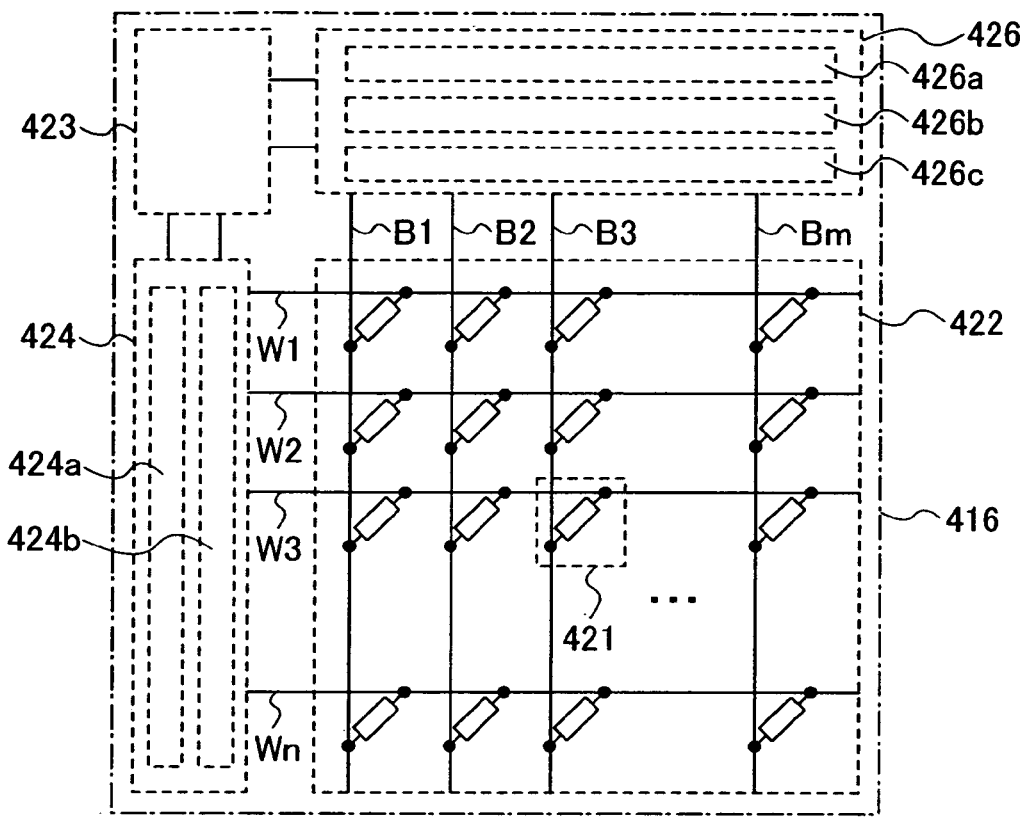
FIGS. 4A and 4B are a diagram of a passive matrix type memory device and a diagram of a reading circuit, respectively.

FIG. 4A shows one structural example of a memory device according to the teachings of the present invention. The memory device includes a memory cell array 422 in which memory cells 421 are provided in a matrix form, a bit line driver circuit 426 having a column decoder 426a, a reading circuit 426b and a writing circuit 426c, a word line driver circuit 424 including a row decoder 424a and a level shifter 424b and an interface 423 which has a wiring circuit or the like and transmit and receive a signal with the external portion. Note that the configuration of the memory device 416 shown here is just one example, and the memory device may have another circuit such as a sense amplifier, an output circuit, or a buffer, and a writing circuit may be provided in the bit line driver circuit.

The memory cell 421 has a first conductive layer forming a word line Wy ($1 \leq y \leq n$), a second conductive layer forming a bit line Bx ($1 \leq x \leq m$), and a layer including an organic compound. The layer including an organic compound is provided as a single layer or a stacked layer between the first conductive layer and the second conductive layer. A word line Wy extending in X direction and a bit line Bx extending in Y direction intersects each other, and they forms one memory element in the intersection portion. In this specification, the intersection portion is referred to as a memory element and the region surrounded by the word line and the bit line (the region including a memory element) is referred to as a memory cell. In addition, a partition formed from an insulating material is provided between adjacent memory elements, so as to cover the vicinity of each first conductive layer.

It should be noted that highly conductive elements or compounds, etc., are used as materials of the first and second conductive layers. Preferably, a conductive material which easily generates bubbles by heat may be used. For example, it may be formed by a sputtering method using an ITO target containing oxygen at 17 wt % to 18 wt % in an atmosphere including oxygen, so that the first conductive layer can include oxygen at 18 wt % or more. Instead of the atmosphere including oxygen, the first conductive layer may be formed in an atmosphere including an inert element such as nitrogen or argon, so that the first conductive layer may include the inert element.

In addition, the layer including an organic compound provided between the first conductive layer and the second conductive layer is a mixed layer of an inorganic insulator and an organic compound or a mixed layer of an organic compound and an inorganic compound, each of which is changed by an electric action.

In this embodiment mode, writing data in the memory cell is conducted by an electric action. The conductivity of the memory cell having the above structure is changed after and before the voltage application, thereby making it possible to store two values corresponding to the initial state and the state after the conductivity has changed, respectively.

The layer including an organic compound provided between the first conductive layer and the second conductive layer may be provided as a single layer or a stacked layer including a plurality of layers. As the organic compound provided between the first conductive layer and the second conductive layer, an organic compound material having a high hole transporting property or an organic compound material having a high electron transporting property can be used. The layer including an organic compound can be formed by an evaporation method, an electron beam evaporation method, a sputtering method, a CVD method or the like. In addition, a mixed layer including the organic compound and the inorganic compound can be formed by depositing each of the materials simultaneously. It can be formed by combining the same method or different kinds of methods, such as co-evaporation by resistance heating evaporation, co-evaporation by electronic beam evaporation, co-evaporation by resistance heating evaporation and electronic beam evaporation, film formation by resistance heating evaporation and sputtering, or film formation by electronic beam evaporation and sputtering.

As the organic compound material having a high hole-transporting property, an aromatic amine compound (in other words, a compound having a benzene ring-nitrogen bond) such as 4,4'-bis[N-(1-naphthyl)-N-phenyl-amino]-biphenyl (abbreviated to α-NPD); 4,4'-bis[N-(3-methylphenyl)-N-phenyl-amino]-biphenyl (abbreviated to TPD); 4,4',4"-tris(N,N-diphenyl-amino)-triphenylamine (abbreviated to TDATA): 4,4',4"-tris[N-(3-methylphenyl)-N-phenyl-amino]-triphenylamine (abbreviated to MTDATA); 4,4'-bis(N-(4-(N,N-di-m-tolylamino)phenyl)-N-phenylamino)biphenyl (abbreviated to DNTPD), or a phthalocyanine compound such as phthalocyanine (abbreviated to $H_2Pc$), copper phthalocyanine (abbreviated to CuPc), vanadyl phthalocyanine (abbreviated to VOPc) can be used. The substances mentioned here are mainly substances having a hole mobility of $10^{-6}$ $cm^2/Vs$ or higher.

As the organic compound material having a high electron-transporting property, a material made of a metal complex having a quinoline skeleton or a benzoquinoline skeleton such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), and bis(2-methyl-8-quinolinolato)-4-phenylphenolato-aluminum (abbreviated to BAlq) can be used. Also, a material such as a metal complex having an oxazole based or a thiazole based ligand such as bis[2-(2-hydroxyphenyl)benzoxazolato]zinc (abbreviated to $Zn(BOX)_2$), and bis[2-(2-hydroxyphenyl)benzothiazolato]zinc (abbreviated to $Zn(BTZ)_2$) can be used. Furthermore, other than a metal complex, 2-(4-biphenylyl)-5-(4-tert-butylphenyl)-1,3,4-oxadiazol (abbreviated to PBD); 1,3-bis[5-(p-tert-butylphenyl)-1,3,4-oxadiazole-2-yl]benzene (abbreviated to OXD-7); 3-(4-tert-butylphenyl)-4-phenyl-5-(4-biphenylyl)-1,2,4-triazole (abbreviated to TAZ); 3-(4-tert-butylphenyl)-4-(4-ethylphenyl)-5-(4-biphenylyl)-1,2,4-triazole (abbreviated to p-EtTAZ); bathophenanthroline (abbreviated to BPhen), bathocuproin (abbreviated to BCP), or the like can be used. The substances mentioned here are mainly substances having an electron mobility of $10^{-6}$ $cm^2/Vs$ or higher.

Here, the change of the conductivity in the memory element before and after the voltage application, is described.

When a voltage is applied between the first conductive layer and the second conductive layer, a current flows to generate heat. The layer including an organic compound provided between the first conductive layer and the second conductive layer has a fluidity when the temperature rises up to a glass transition temperature of a material forming the layer including an organic compound. When the fluidity of the material becomes high, the interval between the first conductive layer and the second conductive layer is easily changed.

When a voltage is applied, the state change accompanying the precipitous change in volume is generated between a pair of electrodes, by a bubble generated in the first conductive layer or from the layer including an organic compound. The short-circuiting between a pair of electrodes is promoted by employing an acting force based on this state change. Further, peeling is partially generated near the interface between the layers by the impact caused by the voltage application in some cases. Therefore, the conductivity of the memory element is changed before and after the voltage application.

As a result of this, writing data in the memory cell can be conducted at a low power consumption.

Figure 4B:
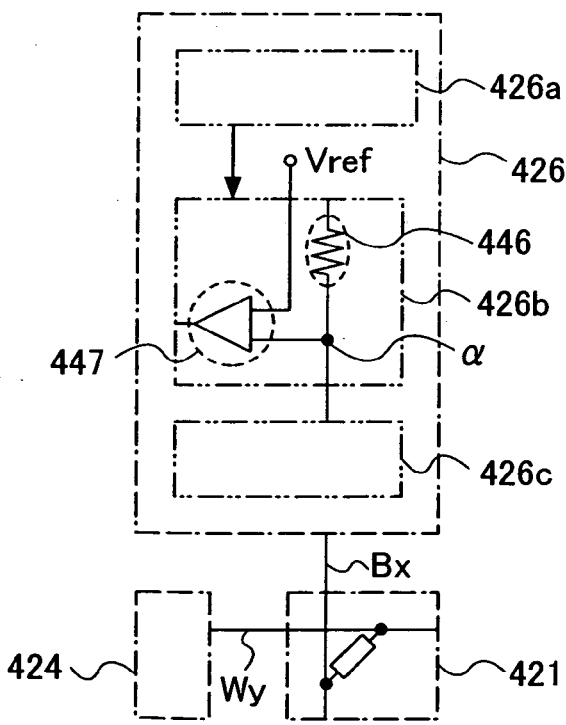

Subsequently, operation in a case of reading data from a memory element will be described (see FIG. 4B). Here, a reading circuit 426b includes a resistor element 446 and a sense amplifier 447. However, the reading circuit 426b is not limited to the above structure, and the reading circuit may have any structure.

Reading data is performed by applying a voltage to the first conductive layer and the second conductive layer to read an electric resistance value of the memory element. For example, in the case of writing the data by applying an electric action as described above, resistance value Ra1 in the case where the electric action is not added, and resistance value Rb1 in the case where the electric value is added so that short-circuiting is caused between the two conductive layers, fulfill Ra1>Rb1. Reading data is performed by electrically reading such a difference in the resistance value.

For example, data of one memory cell 421 disposed in an x-th column and a y-th row is read, from the memory cell array 422 including the plurality of memory cells. In that case, first, a bit line Bx in the x-th column and a word line Wy in the y-th row are selected by the row decoder 424a, the column decoder 426a, and the selector 426c. Then, the insulating layer included in the memory cell 421 and a resistor element 446 are in such a state that they are connected in series. Thus, a voltage is applied to the opposite ends of the two connected resistor elements in series, the electric potential of a node α becomes a resistance-divided electric potential in accordance with the resistance value Ra or Rb of the insulating layer 452. The electric potential of the node α is supplied to the sense amplifier 447. In the sense amplifier 447, which of the information "0" and "1" is contained is judged. After that, a signal containing the information "0" or "1" judged by the sense amplifier 447 is supplied to the outside.

In accordance with the above method, the state of the electric resistance in the memory element is read by a voltage value utilizing the difference in the resistance value and the resistance division. However, a method in which current values are compared may be employed. This method, for example, utilizes that current value Ia1 in the case where the electric action is not added to the first conductive layer and the second conductive layer, and resistance value Ib1 in the case where the electric action is added to the first conductive layer and the second conductive layer so that short-circuit is caused between the two conductive layers, fulfill Ia1<Ib1.

Since a memory element having the above structure and a semiconductor device provided with the memory element are nonvolatile memories, an electric battery for storing data is not required to be incorporated. A small-sized, thin, and lightweight semiconductor device can be provided.

It is to be noted that a passive matrix type memory element of which a memory circuit is a simple and the semiconductor device provided with the memory element have been taken as examples in this embodiment mode. However, even in a case of using an active matrix type memory circuit, data can be written or read in a similar manner.

In addition, this embodiment mode can be freely combined with Embodiment Mode 1.

Embodiment Mode 3

In Embodiment Mode 3, a memory device that has a different structure from that of Embodiment Mode 2, will be described. Specifically, the case where the memory device has an active matrix structure will be shown.

Figure 5A:
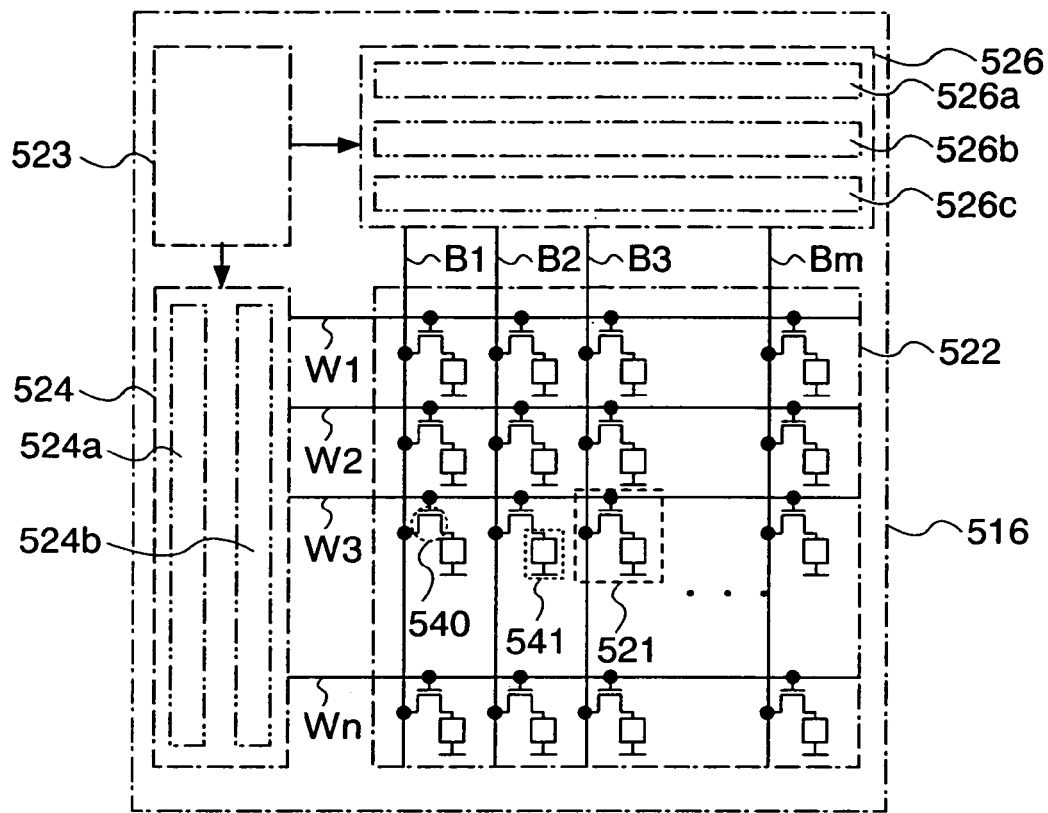
FIGS. 5A and 5B are diagrams of an active matrix type memory device.

FIG. 5A shows a structural example of a memory device that is shown in this embodiment mode. The memory device includes a memory cell array 522 in which memory cells 521 are provided in a matrix, a bit line driver circuit 526 having a column decoder 526a, a reading circuit 526b, and a selector 526c, a word line driver circuit 524 having a low decoder 524a and a level shifter 524b, and a interface 523 having a writing circuit and the like and communicating with the outside. It is to be noted that a structure of a memory device 516 shown here is only one example. The memory device 516 may include other circuits such as a sense amplifier, an output circuit, and a buffer. The writing circuit may be provided in the bit line driver circuit.

The memory cell array 521 includes a first wiring forming a word line Wy ($1 \leq y \leq n$), a second wiring forming a bit line Bx ($1 \leq x \leq m$), a transistor 540, a memory element 541, and the memory cell 521. The memory element 541 has a structure in which an insulating layer (a layer including an organic compound) is interposed between a pair of conductive layers.

Figure 5B:
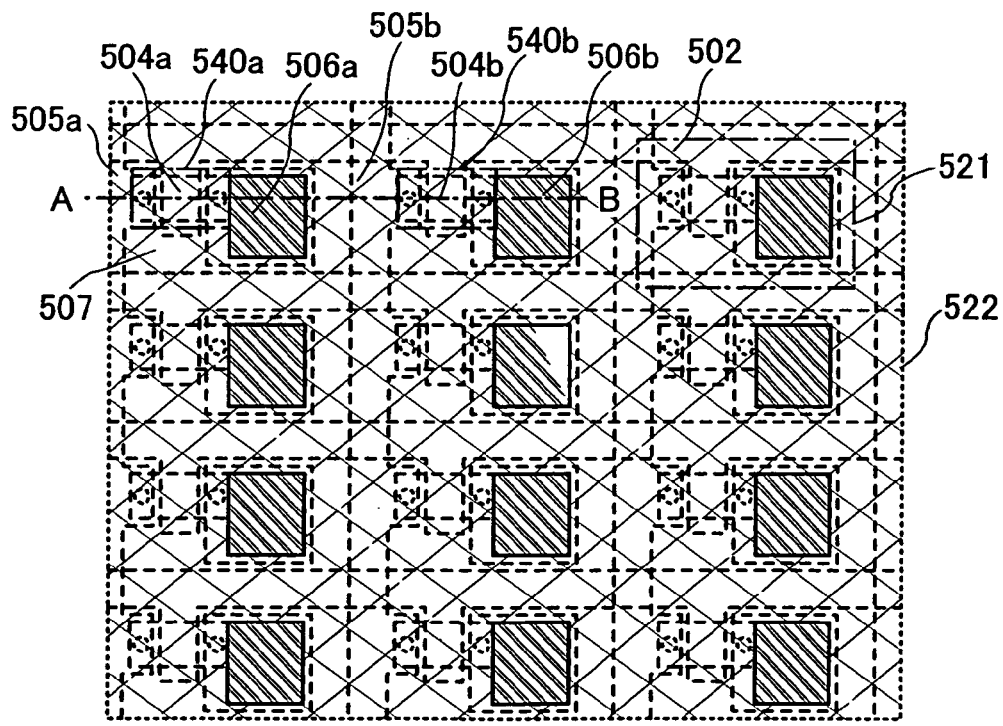

FIG. 5B shows a top view of the memory cell array 522, which corresponds to the block diagram of FIG. 5A.

In the memory cell array 522, a first wiring 505a and a first wiring 505b extending in a first direction, and a second wiring 502 extending in a second direction that is perpendicular to the first direction are provided in a matrix. Each of the first wirings is connected to a source electrode or a drain electrode of a transistor 540a and a transistor 540b. The second wiring is connected to gate electrodes of the transistor 540a and the transistor 540b. Further, each of a first conductive layer 506a and a first conductive layer 506b is connected to source electrodes or drain electrodes of the transistors 540a and 540b, which are not connected with the first wirings. Then, an insulating layer 512 and a second conductive layer 513 are stacked over each of the first conductive layer 506a and the first conductive layer 506b to provide a memory element 541a and a memory element 541b. Partitions (insulating layers) 507 are provided between adjacent each memory cell 521, and the layer including an organic compound 512 and the second conductive layer 513 are stacked over the first conductive layers and the partitions 507.

Figure 6:
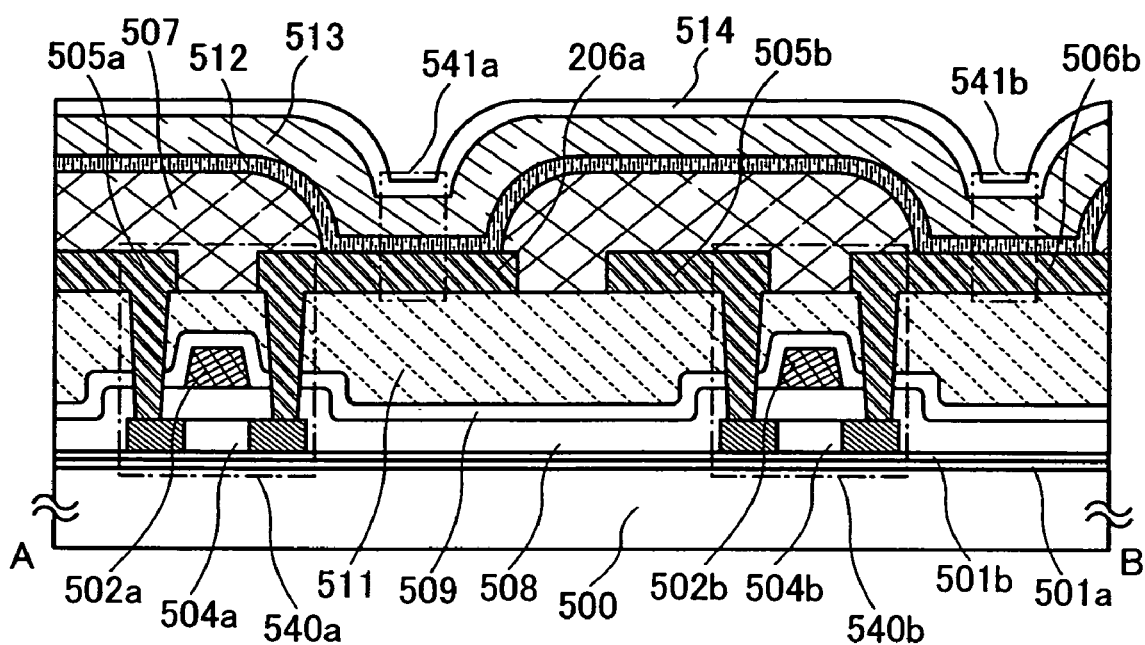
FIG. 6 is a cross-sectional view of an active matrix type memory device.

A protective layer 514 is provided over the second conductive layer 513. In addition, as the transistors 540a and 540b, thin film transistors (TFT) are used. FIG. 6 shows a cross section taken along the line A-B in FIG. 5B. It should be noted that the same reference numerals are used for the same portions in FIG. 6 as those in FIG. 5A or 5B.

The memory device shown in FIG. 6 is provided over a substrate 500 having an insulating surface, and a first base insulating layer 501a, a second base insulating layer 501b, a gate insulating layer 508, a first interlayer insulating layer 509, and a second interlayer insulating layer 511 are provided. In addition, over the substrate 500, a semiconductor layer 504a forming a transistor 540a, a gate electrode layer 502a, and a wiring 505a also serving as a source electrode layer or a drain electrode layer are provided.

Although the example of a top gate TFT has been described here, the present invention can be applied regardless of a TFT structure, and the present invention can be applied to a bottom gate TFT (an inversely staggered TFT) or a staggered type TFT. In addition, without being limited to a single gate transistor, a multigate transistor having plural channel forming regions, for example, a double gate transistor may be used.

The present invention is not limited to the TFT structure shown in FIG. 6, and a lightly doped drain (LDD) structure having an LDD region between a channel forming region and a drain region (or a source region) may be employed as necessary. This structure has a region which is doped with an impurity element at a low concentration between a channel forming region and a source region or a drain region formed by adding a high concentration of an impurity element. This region is called as an LDD region. Alternatively, a GOLD structure (gate-drain overlapped LDD) may be employed in which an LDD region overlaps the gate electrode between the gate insulating film therebetween.

Although the thin film transistors formed over the glass substrate are shown as the examples of the transistors 540a 540b, there is no particular limitations. A field effect transistor (FET) formed on a semiconductor substrate such as Si can be used as the transistors 540a and 540b. In addition, an SOI substrate is used as the substrate and an element formation layer may be provided thereover. The SOI substrate may be formed by a SIMOX method by which an insulating layer is formed inside by attaching wafers or by implanting oxygen ions into a Si substrate.

Writing or reading data can be conducted in this embodiment mode in the same way as in Embodiment Mode 2.

Figure 7A:
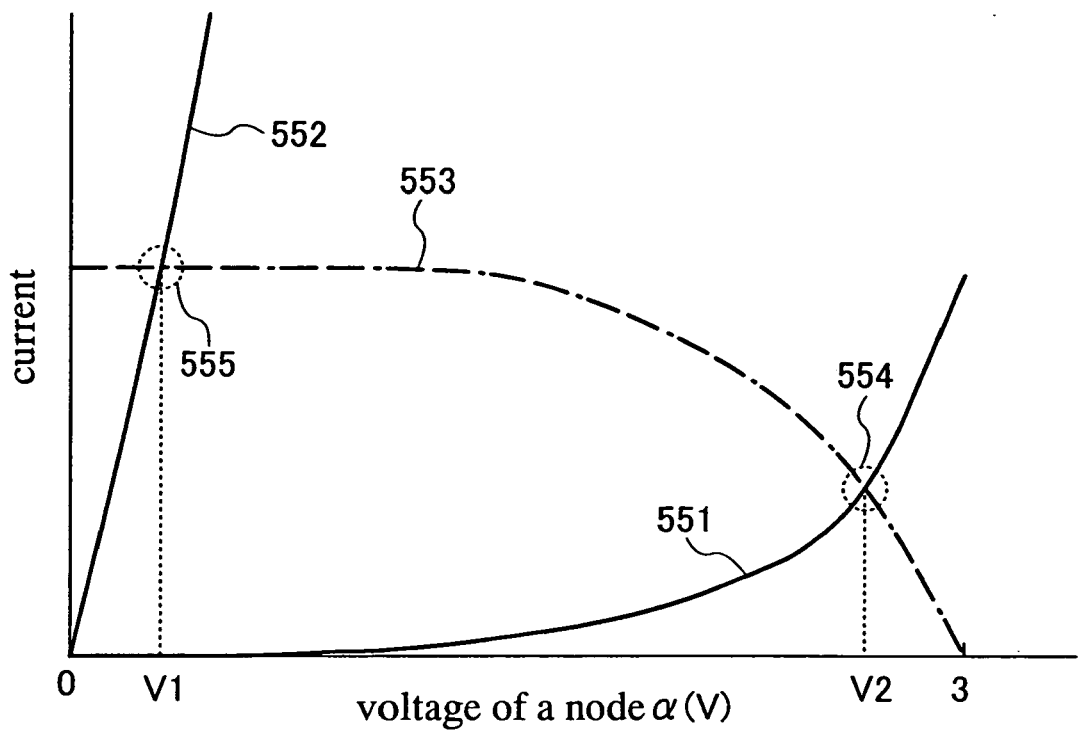
FIGS. 7A and 7B are a graph showing a current-voltage characteristic and a diagram of a reading circuit, respectively.
Figure 7B:
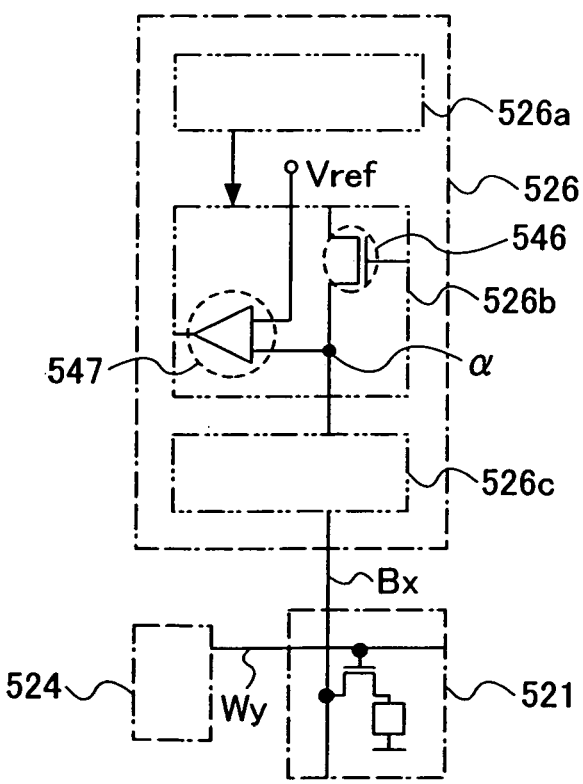

FIGS. 7A and 7B shows specific examples of a case in which data of a memory element portion is read by an electric action in an active matrix type device.

An example having a structure shown in FIG. 7B is described. Here, a reading circuit 526b includes a resistor element and a sense amplifier 547. However, the reading circuit 526b is not limited to the above structure, and the reading circuit may have any structure.

Reading data is performed by applying a voltage to the first conductive layer and the second conductive layer and reading an electric resistance value of the memory element. For example, in the case of writing the data by an electric action as described above, resistance value Ra1 in the case where the electric action is not added, and resistance value Rb1 in the case where the electric action is added so that short-circuiting is caused between the two conductive layers, fulfill Ra1>Rb1. Reading data is performed by electrically reading such a difference in the resistance value.

For example, data of one memory cell 521 disposed in an x-th column and a y-th row is read, from a memory cell array 522 including the plurality of memory cells. In that case, first, a bit line Bx in the x-th column and a word line Wy in the y-th row are selected by a row decoder 524a, a column decoder 526a, and a selector 526c. Then, the insulating layer included in the memory cell 521 and a resistor element are in such a state that they are connected in series. Thus, when a voltage is applied to the opposite ends of the two connected resistor elements in series, the electric potential of a node α becomes a resistance-divided electric potential in accordance with the resistance value Ra or Rb of the memory element (layer including an organic compound). The electric potential of the node α is supplied to a sense amplifier 547. In the sense amplifier 547, which of the information "0" and "1" is contained is judged. After that, a signal containing the information "0" or "1" judged by the sense amplifier 547 is supplied to the outside.

FIG. 7A shows current-voltage characteristics 551 of a memory element portion in which data "0" is written, current-voltage characteristics 552 of a memory element portion in which data "1" is written, and current-voltage characteristics 553 of the resistor element. Here, the case of using a transistor 546 as the resistor element is shown. In addition, the case of applying 3 V between the first conductive layer 506a and the second conductive layer 513 as operation voltage in reading data will be described.

In FIG. 7A, as for a memory cell having a memory element portion in which data "0" is written, an intersection point 554 of the current-voltage characteristics 551 of the memory element portion and the current-voltage characteristics 553 of the transistor is an operational point, and potential of a node α at this time is V1 (V). The potential of the node α is supplied to the sense amplifier 547. The data stored in the memory cell is recognized as "0" in the sense amplifier 547.

Meanwhile, as for a memory cell having a memory element portion in which data "1" is written, an intersection point 555 of the current-voltage characteristics 552 of the memory element portion and the current-voltage characteristics 553 of the transistor is an operational point, and the potential of a node α at this time is V2 (V) (V1>V2). The potential of the node α is supplied to the sense amplifier 547. The data stored in the memory cell is recognized as "1" in the sense amplifier 547.

Thus, the data stored in the memory cell can be distinguished by reading the potential divided by resistance in accordance with the resistance value of the memory element portion 541.

This embodiment mode can be freely combined with Embodiment Mode 1 or Embodiment Mode 2.

Embodiment Mode 4

Embodiment Mode 4 describes an example of a semiconductor device having a memory device shown in the above embodiment modes, with reference to the drawings.

One feature of the semiconductor device shown in Embodiment Mode 4 is that the semiconductor device can write and read data without contacts. Data transmission system is broadly classified into three of an electromagnetic coupling method of communicating by mutual induction with a pair of coils disposed in the opposed position, an electromagnetic induction method of communicating by an inductive electromagnetic wave, and an electric wave method of communicating by using electric waves, and any of these methods may be employed. An antenna that is used for transmitting data can be provided in two ways. One way is to provide the antenna over a substrate provided with a plurality of elements and a memory element, and the other way is to provide a terminal portion over a substrate provided with a plurality of elements and a memory element and to connect an antenna provided over another substrate to the terminal portion.

First, a structural example of a structure of a semiconductor device in the case of providing an antenna over a substrate provided with a plurality of elements and a memory element will be described with reference to FIG. 8.

Figure 8:
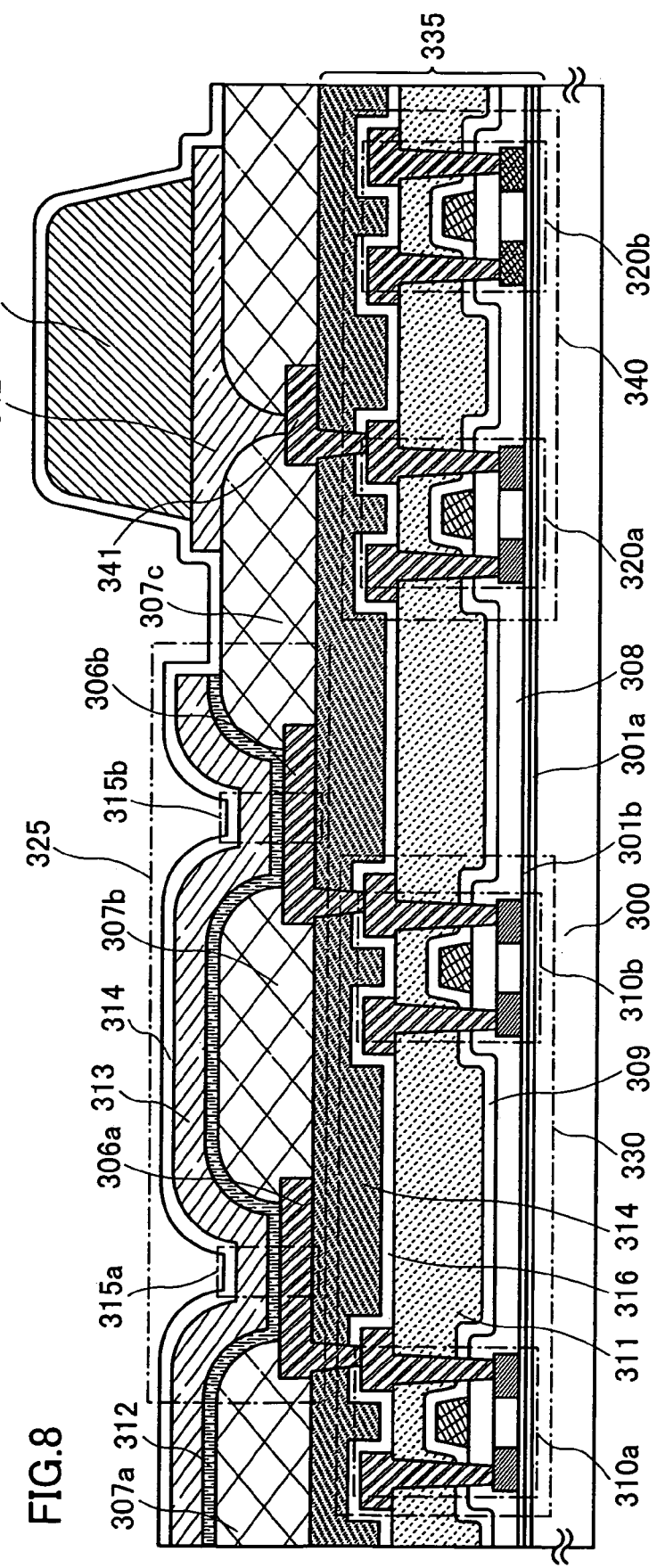
FIG. 8 is a cross-sectional view of a semiconductor device according to an aspect of the present invention.

FIG. 8 shows a semiconductor device including a memory device that has an active matrix structure. A transistor portion 330 including transistors 310a and 310b, a transistor portion 340 including transistors 320a and 320b, and an element formation layer 335 including insulating layers 301a, 301b, 308, 309, 311, 316, and 314 are provided over a substrate 300. A memory element portion 325 and a conductive layer 343 serving as an antenna are provided in the upper side of the element formation layer 335.

It is to be noted that, here, the case where the memory element portion 325 or the conductive layer 343 serving as an antenna is provided in the upper side of the element formation layer 335 is shown; however, the present invention is not to limited to this structure, and it is possible to provide the memory element portion 325 or the conductive layer 343 serving as an antenna in the lower side of the element formation layer 335 or in the same layer thereof.

The memory element portion 325 includes memory elements 315a and 315b. The memory element 315a is formed by stacking a partition (insulating layer) 307a, a partition (insulating layer) 307b, an insulating layer 312, and a second conductive layer 313 over a first conductive layer 306a. The memory element 315b is provided by stacking the partition (insulating layer) 307b, a partition (insulating layer) 307c, the insulating layer 312, and the second conductive layer 313 over a first conductive layer 306b. Further, an insulating layer 314 serving as a protective film is formed to cover the second conductive layer 313.

In the memory element 315a, the first conductive layer 306a is provided and the first conductive layer 306a is connected to a source electrode layer or a drain electrode layer of the transistor 310a. In the memory element 315b, the first conductive layer 306b is provided, and the first conductive layer 306b is connected to a source electrode layer or a drain electrode layer of the transistor 310b. In other words, each memory element is connected to one transistor. The insulating layer 312 is provided wholly to cover the first conductive layers 306a, 306b and the partitions (insulating layers) 307a, 307b, 307c; however, it may be selectively formed in each memory cell. Note that the memory elements 315a, and 315b can be formed using the materials and the manufacturing method described in the above embodiment modes.

In the memory element 315a, a rectifying element may be provided between the first conductive layer 306a and the insulating layer 312, or between the insulating layer 312 and the second conductive layer 313. The rectifying element can also be provided by using any of the above materials. In addition, the same can be applied to the memory element 315b.

Here, the conductive layers 342 and 343 serving as antennas are provided over a conductive layer 341 that is formed of the same layer with the second conductive layer 313. A conductive layer serving as an antenna may be formed of the same layer with the second conductive layer 313.

As a material of the conductive layer 343 serving as an antenna, an element selected from gold (Au), platinum (Pt), nickel (Ni), tungsten (W), molybdenum (Mo), cobalt (Co), copper (Cu), aluminum (Al), manganese (Mn), or titanium (Ti) or an alloy containing some of the elements can be used. Further, an evaporation method, sputtering, a CVD method, any printing method such as gravure printing or screen printing, a droplet discharging method, or the like can be used to form the conductive layer 343 serving as an antenna.

Each of the transistors 310a and 310b included in the element formation layer 335 can be provided by a p-channel TFT or an n-channel TFT, or a CMOS circuit combining a p-channel TFT and an n-channel TFT. Further, any structure may be used for a semiconductor layer included in the transistors 310a and 310b. For example, an impurity region (including a source region, a drain region, or an LDD region) may be formed, and either a p-channel type or an n-channel type may be employed. An insulating layer (sidewall) may be formed to be in contact with a side face of the gate electrode, or a silicide layer may be formed for either or both of source and drain regions and the gate electrode. As a material for the silicide layer, nickel, tungsten, molybdenum, cobalt, platinum, or the like can be used.

Each of the transistors 310a and 310b included in the element formation layer 335 may be provided using an organic transistor in which a semiconductor layer forming the transistors is formed of an organic compound. In this case, the element formation layer 335 including the organic transistor can be formed by using a printing method, a droplet discharging method, or the like over the substrate 300 that is a flexible substrate such as a plastic substrate. By using a printing method, a droplet discharging method, or the like, a semiconductor device can be manufactured at low cost.

Further, the element formation layer 335, the memory elements 315a, and 315b, and the conductive layer 343 serving as an antenna can be formed by an evaporation method, sputtering, a CVD method, a printing method, a droplet discharging method or the like as described above. It is to be noted that different methods may be employed to form different parts. For example, in order to obtain a transistor requiring high-speed operation, a semiconductor layer formed of Si or the like is provided over a substrate and crystallized by a heat treatment, and then, a transistor serving as a switching element can be provided as an organic transistor in the upper side of a element formation layer by using a printing method, or a droplet discharging method.

It is to be noted that a sensor connecting to the transistor may be provided. As the sensor, an element for detecting properties such as temperature, humidity, illuminance, gas, gravity, pressure, sound (vibration), and acceleration by a physical means or a chemical means can be cited. The sensor can be formed by a semiconductor element such as a resistor element, a capacitive coupling element, an inductive coupling element, a photovoltaic element, a photoelectric conversion element, a thermoelectric element, a transistor, a thermistor, or a diode.

Transferring to a flexible substrate may be conducted by a peeling technique. In that case, after providing a peeling layer or a separation layer over a first substrate such as a glass substrate, a TFT and a memory are formed. Peeling is made to occur inside of the peeling layer or at the interface thereof, or the separation layer is removed to peel the TFT and the memory from the first substrate. The peeled TFT and memory may be transferred to the second substrate which is flexible.

In addition, this embodiment mode can be freely combined with Embodiment Mode 1, 2, or 3.

Embodiment Mode 5

Figure 9A:
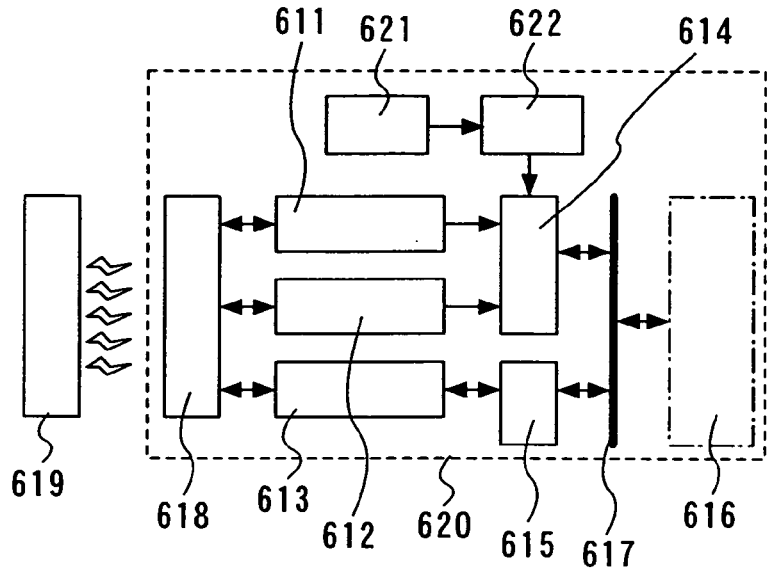
FIGS. 9A and 9B show a structural example of a semiconductor device according to an aspect of the present invention, and a view of an electronic device having the semiconductor device.

A structure of a semiconductor device according to this embodiment mode will be described with reference to FIG. 9A. As shown in FIG. 9A, a semiconductor device 620 of the present invention has a function of communicating data without contact, and includes a power supply circuit 611, a clock generation circuit 612, a data demodulation/modulation circuit 613, a control circuit 614 for controlling other circuits, an interface circuit 615, a memory circuit 616, a data bus 617, an antenna (antenna coil) 618, a sensor 621, and a sensor circuit 622.

By the power supply circuit 611, various kinds of power supplies, which are supplied to each circuit in the semiconductor device 620, are generated in accordance with an alternating current signal inputted from the antenna 618. By the clock generation circuit 612, various kinds of clock signals, which are supplied to each circuit in the semiconductor device 620, are generated in accordance with an alternative current signal inputted from the antenna 618. The data demodulation/modulation circuit 613 has a function of demodulating/modulating data communicated with a reader/writer 619. The control circuit 614 has a function of controlling the memory circuit 616. The antenna 618 has a function of transmitting/receiving electromagnetic fields or electric waves. The reader/writer 619 communicates with and controls the semiconductor device, and controls a process with regard to the data of the semiconductor device. It is to be noted that the structure of the semiconductor device is not limited to the above structure, for example, other elements such as a limiter circuit of a power supply voltage and hardware dedicated to encryption may be additionally provided.

The memory circuit 616 has a memory element where an insulating layer which is changed by an external electric action or light-irradiation is interposed between a pair of conductive layers. It is to be noted that the memory circuit 616 may have only the memory element where an insulating layer is interposed between a pair of conductive layers, or may have another memory circuit with a different structure. The memory circuit with a different structure corresponds, for example, to one or more selected from a DRAM, an SRAM, a mask ROM, a PROM, an EPROM, an EEPROM, or a flash memory.

The sensor 623a is formed using a semiconductor element such as a resistor element, a capacitive coupling element, an inductive coupling element, a photovoltaic element, a photoelectric conversion element, a thermoelectric element, a transistor, a thermistor, or a diode. The sensor circuit 623a detects changes in impedance, reactance, inductance, voltage, or current, and performs analog/digital (A/D) conversion to output a signal to the control circuit 614.

Figure 9B:
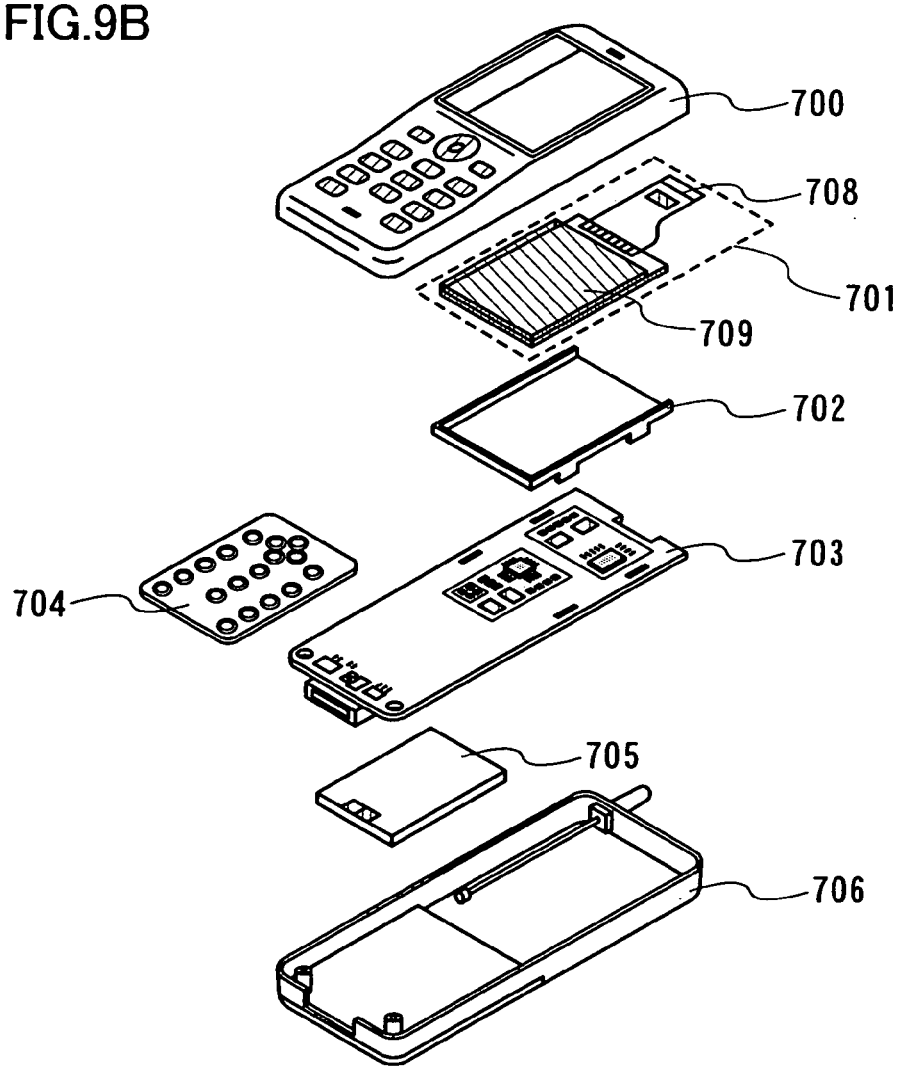

Next, a mode of an electronic device where the semiconductor device of the present invention is mounted is described with reference to the drawings. The electronic device shown here is a cellular phone including frame bodies 700 and 706, a panel 701, a housing 702, a printed wiring board 703, operation switches 704, and a battery 705 (see FIG. 9B). The panel 701 is detachably incorporated in the housing 702. The housing 702 is fitted into the printed wiring board 703. A shape and dimension of the housing 702 are appropriately changed in accordance with the electronic device where the panel 701 is to be incorporated. On the printed wiring board 703, a plurality of packaged semiconductor devices are mounted and the semiconductor device of the present invention can be used as one of the plurality of packaged semiconductor devices. The plurality of semiconductor devices mounted on the printed wiring board 703 has any one of functions of a controller, a central processing unit (CPU), a memory, a power source circuit, an audio processing circuit, a transmitting-receiving circuit, and the like.

The panel 701 is fixedly connected with the printed wiring board 703 through a connection film 708. The above panel 701, the housing 702, and the printed wiring board 703 are placed in the frame bodies 700 and 706 together with the operation switches 704 and the battery 705. A pixel region 709 included in the panel 701 is provided so as to be observed through an opening window provided in the frame body 700.

As described above, the semiconductor device according to the present invention is small, thin, and lightweight, thereby the limited space in the frame bodies 700 and 706 of the electronic device can be efficiency used.

In addition, since the semiconductor device of the present invention includes a memory element having a simple structure in which an insulating layer which is changed by an external electric action (i.e., a layer including an organic compound interposed between a pair of electrodes) and is interposed between a pair of conductive layers, an electronic device using an inexpensive semiconductor device can be provided. Further, since high integration is easy for the semiconductor device of the present invention, an electronic device using a semiconductor device including a high-capacity memory circuit can be provided.

It is to be noted that the frame bodies 700 and 706 are shown as an example of an exterior of the mobile phone, and the electronic device according to the present embodiment mode can be changed variously in accordance with the function or the intended purpose thereof.

This embodiment mode can be freely combined with Embodiment Mode 1, 2, 3, or 4.

Embodiment Mode 6

Figure 10A:
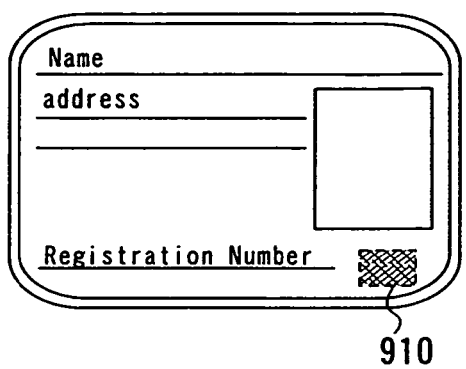
FIGS. 10A to 10F show usage modes of semiconductor devices according to an aspect of the present invention.
Figure 10B:
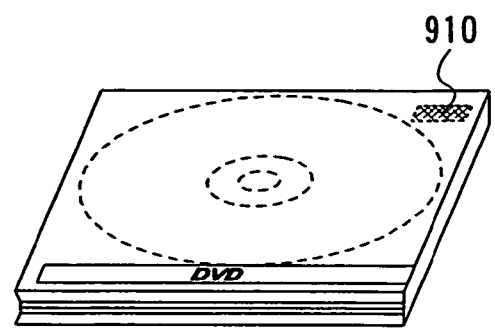
Figure 10C:
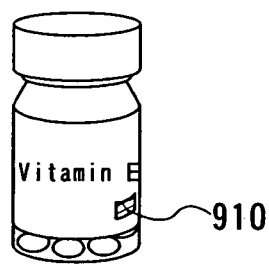
Figure 10D:
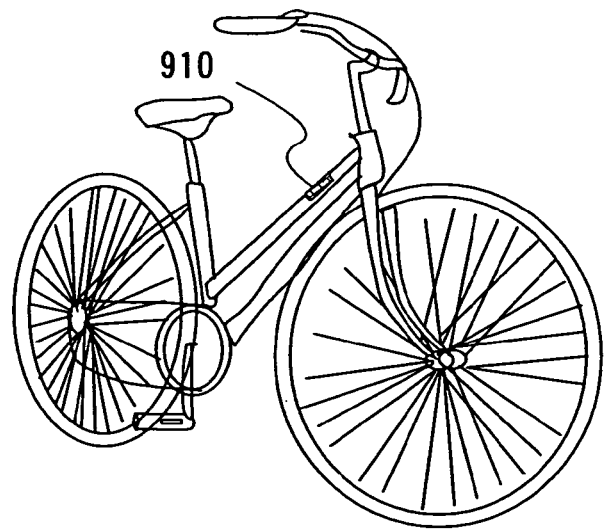
Figure 10E:
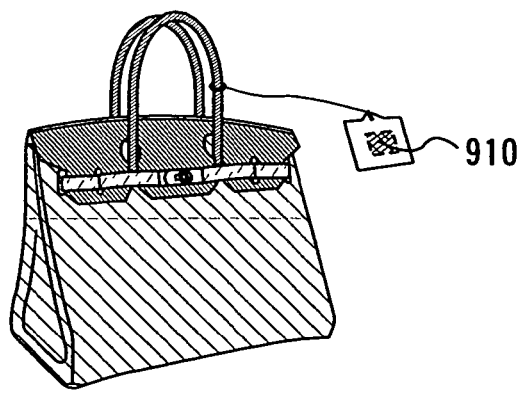
Figure 10F:
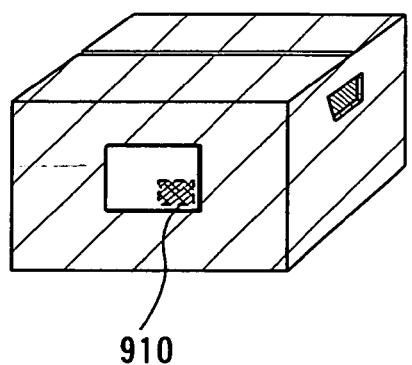

In accordance with the present invention, a semiconductor device functioning as a wireless chip can be formed. Wireless chips can be used broadly, and can be used by being mounted in objects such as bills, coins, securities, bearer bonds, certificates (driver's licenses, resident cards, and the like, refer to FIG. 10A), containers for wrapping objects (wrapping paper, bottles, and the like, refer to FIG. 10C), recording media (DVDs, video tapes, and the like, refer to FIG. 10B), vehicles (bicycles and the like, refer to FIG. 10D), personal belongings (bags, glasses, and the like), foods, plants, animals, human bodies, clothes, livingware, and products such as electronic devices, or shipping tags of baggage (refer to FIGS. 10E and 10F). The electronic device indicates a liquid crystal display device, an EL display device, a television unit (also simply referred to as a TV, a TV set, or a TV receiver), a cellular phone, or the like.

The semiconductor device 910 according to the present invention is mounted on a printed substrate, attached to a surface, or incorporated to be fixed in an object. For example, the semiconductor device is incorporated in paper of a book, or an organic resin of a package to be fixed in each object. As for the semiconductor device 910 according to the present invention, a small size, a thin shape and lightweight are achieved and an attractive design of the object itself is not damaged even after being fixed in the object. In addition, by providing the semiconductor device 910 according to the present invention in bills, coins, securities, bearer bonds, certificates, and the like, a certification function can be obtained and forgery thereof can be prevented by making the use of the certification function. Further, by providing the semiconductor device 910 according to the present invention in containers for wrapping objects, recording media, personal belongings, foods, clothes, livingware, electronic devices, and the like, a system such as an inspection system can be performed efficiently.

This embodiment mode can be freely combined with Embodiment Mode 1, 2, 3, 4 or 5.

This application is based on Japanese Patent Application serial No 2005-103559 filed in Japan Patent Office on Mar. 31, in 2005, the entire contents of which are hereby incorporated by reference.

What is claimed is:

1. A semiconductor device comprising: a plurality of memory elements; and a partition formed between adjacent memory elements, wherein the memory elements each have a stacked structure of a first conductive layer, a layer including an organic compound and a second conductive layer, wherein the memory elements each have a bubble generation area, wherein the layer is formed over the first conductive layer and the partition, wherein the second conductive layer is formed over the layer and the partition, and wherein a bubble is generated between the first conductive layer and the second conductive layer from the bubble generation area, by applying a voltage to the first conductive layer and the second conductive layer, and short-circuiting is caused between the first conductive layer and the second conductive layer by a pressure caused by the generated bubble to write data in the memory element.

2. The semiconductor device according to claim 1, wherein the layer including an organic compound includes an organic compound having a glass transition temperature of 50° C. to 200° C.

3. The semiconductor device according to claim 1, further comprising a plurality of bit lines extending in a first direction and a plurality of word lines extending in a second direction which is perpendicular to the first direction,
wherein the first conductive layer is electrically connected to the bit lines and the second conductive layer is electrically connected to the word lines.

4. A semiconductor device comprising: a plurality of memory elements; and a partition formed between adjacent memory elements, wherein the memory elements each have a stacked structure of a first conductive layer, a layer including an organic compound and a second conductive layer, wherein the memory elements each have a bubble generation area, and the bubble generation area includes a part of the first conductive layer, wherein the layer is formed over the first conductive layer and the partition, wherein the second conductive layer is formed over the layer and the partition, and wherein a bubble is generated between the first conductive layer and the second conductive layer from the bubble generation area, by applying a voltage to the first conductive layer and the second conductive layer, and short-circuiting is caused between the first conductive layer and the second conductive layer by a pressure caused by the generated bubble to write data in the memory element.

5. The semiconductor device according to claim 4, wherein the layer including an organic compound includes an organic compound having a glass transition temperature of 50° C. to 200° C.

6. The semiconductor device according to claim 4, further comprising a plurality of bit lines extending in a first direction and a plurality, of word lines extending in a second direction which is perpendicular to the first direction,
wherein the first conductive layer is electrically connected to the bit lines and the second conductive layer is electrically connected to the word lines.

7. A semiconductor device comprising: a plurality of memory elements; and a partition formed between adjacent memory elements, wherein the memory elements each have a stacked structure of a first conductive layer, a layer including an organic compound and a second conductive layer, wherein the memory elements each have a bubble generation area, and the bubble generation area includes a portion of the layer including an organic compound, wherein the layer is formed over the first conductive layer and the partition, wherein the second conductive layer is formed over the layer and the partition, and wherein a bubble is generated between the first conductive layer and the second conductive layer from the bubble generation area, by applying a voltage to the first conductive layer and the second conductive layer, and short-circuiting is caused between the first conductive layer and the second conductive layer by a pressure caused by the generated bubble to write data in the memory element.

8. The semiconductor device according to claim 7, wherein the layer including an organic compound includes an organic compound having a glass transition temperature of 50° C. to 200° C.

9. The semiconductor device according to claim 7, further comprising a plurality of bit lines extending in a first direction and a plurality of word lines extending in a second direction which is perpendicular to the first direction,
wherein the first conductive layer is electrically connected to the bit lines and the second conductive layer is electrically connected to the word lines.

10. A semiconductor device comprising: a plurality of memory elements; and a partition formed between adjacent memory elements, wherein the memory elements each have a stacked structure of a first conductive layer, a layer including an organic compound and a second conductive layer, wherein the memory elements each have a bubble generation area, and the bubble generation area includes a portion of the second conductive layer, wherein the layer is formed over the first conductive layer and the partition, and wherein the second conductive layer is formed over the layer and the partition, and wherein a bubble is generated between the first conductive layer and the second conductive layer from the bubble generation area, by applying a voltage to the first conductive layer and the second conductive layer, and short-circuiting is caused between the first conductive layer and the second conductive layer by a pressure caused by the generated bubble to write data in the memory element.

11. The semiconductor device according to claim 10, wherein the layer including an organic compound includes an organic compound having a glass transition temperature of 50° C. to 200° C.

12. The semiconductor device according to claim 10, further comprising a plurality of bit lines extending in a first direction and a plurality of word lines extending in a second direction which is perpendicular to the first direction,
wherein the first conductive layer is electrically connected to the bit lines and the second conductive layer is electrically connected to the word lines.

13. A semiconductor device comprising:
a plurality of bit lines extending in a first direction;
a plurality of word lines extending in a second direction which is perpendicular to the first direction; and
a memory circuit including a memory element,
wherein the memory element has a stacked structure of a first conductive layer forming the bit lines, a layer including an organic compound, and a second conductive layer forming the word lines,
wherein the memory element has a bubble between the first conductive layer and the second conductive layer, and
wherein the memory element has a short-circuiting portion of the first conductive layer in contact with the second conductive layer.

14. The semiconductor device according to claim 13, wherein the bubble is overlapped with a portion of the first conductive layer and a portion of the second conductive layer, and
wherein an interval of the portion of the first conductive layer and the portion of the second conductive layer is larger than other portions.

15. A driving method of a semiconductor device comprising the steps of:
applying a voltage to a memory device in which a first conductive layer, a layer including an organic compound and a second conductive layer formed over the first conductive layer;
generating a bubble between the first conductive layer and the second conductive layer; and
short-circuiting the first conductive layer and the second conductive layer by a pressure based on the generated bubble so as to write data in the memory element.

16. The driving method of a semiconductor device according to claim 15, wherein the layer including an organic compound includes an organic compound having a glass transition temperature of 50° C. to 200° C.

17. The semiconductor device according to claim 13, further comprising a partition formed between adjacent memory elements,
wherein the layer forms over the first conductive layer and the partition, and
wherein the second conductive layer forms over the layer and the partition.

* * * * *